United States Patent
Cheng et al.

(10) Patent No.: US 9,563,122 B2
(45) Date of Patent: Feb. 7, 2017

(54) METHOD TO HARDEN PHOTORESIST FOR DIRECTED SELF-ASSEMBLY PROCESSES

(71) Applicant: INTERNATIONAL BUSINESS MACHINES CORPORATION, Armonk, NY (US)

(72) Inventors: Joy Cheng, San Jose, CA (US); Matthew E. Colburn, Schenectady, NY (US); Chi-Chun Liu, Altamont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/697,669

(22) Filed: Apr. 28, 2015

(65) Prior Publication Data

US 2016/0320701 A1    Nov. 3, 2016

(51) Int. Cl.
   *G03F 7/40*   (2006.01)
   *G03F 7/039*   (2006.01)
   *H01L 21/308*   (2006.01)

(52) U.S. Cl.
   CPC ............. *G03F 7/039* (2013.01); *G03F 7/40* (2013.01); *H01L 21/3086* (2013.01)

(58) Field of Classification Search
   CPC .......................................................... G03F 7/40
   See application file for complete search history.

(56) References Cited

U.S. PATENT DOCUMENTS

| | | | |
|---|---|---|---|
| 4,125,650 A | 11/1978 | Chiu et al. | |
| 6,541,361 B2 | 4/2003 | Ko et al. | |
| 7,605,081 B2 | 10/2009 | Yang et al. | |
| 7,709,079 B2 | 5/2010 | Black et al. | |
| 7,855,105 B1 | 12/2010 | Jagannathan et al. | |
| 7,977,247 B2 | 7/2011 | Black et al. | |
| 8,137,893 B2 | 3/2012 | Burns et al. | |
| 8,207,028 B2 | 6/2012 | Dalton et al. | |
| 8,450,418 B2 | 5/2013 | Millward et al. | |
| 8,735,046 B2 | 5/2014 | Hatakeyama et al. | |
| 2003/0129816 A1 | 7/2003 | Ko et al. | |

(Continued)

FOREIGN PATENT DOCUMENTS

| | | |
|---|---|---|
| DE | 198 57 094 A1 | 9/1999 |
| JP | 5-241353 A | 9/1993 |

(Continued)

OTHER PUBLICATIONS

Tsai, H. et al., "Pattern transfer of directed self-assembly (DSA) patterns for CMOS device applications", Proc. of SPIE, vol. 8685, Mar. 2013, 86850L, pp. 1-9.

(Continued)

*Primary Examiner* — Kathleen Duda
(74) *Attorney, Agent, or Firm* — Scully, Scott, Murphy & Presser, P.C.; Daniel P. Morris, Esq.

(57) ABSTRACT

A patterned photoresist is provided atop a substrate. A hardening agent is applied to the patterned photoresist to provide a polymeric coated patterned photoresist. The polymeric coated patterned photoresist is baked to provide a hardened photoresist, and subsequent the baking step, the polymeric coating is removed from the hardened photoresist by rinsing. The hardened photoresist can be removed anytime during the patterning of the substrate by an aqueous resist developer.

19 Claims, 3 Drawing Sheets

(56) References Cited

U.S. PATENT DOCUMENTS

| | | | |
|---|---|---|---|
| 2010/0183851 A1* | 7/2010 | Cao | C08F 220/34 |
| | | | 428/195.1 |
| 2011/0147985 A1 | 6/2011 | Cheng et al. | |
| 2014/0021166 A1 | 1/2014 | Seino et al. | |
| 2014/0072915 A1 | 3/2014 | Chen et al. | |
| 2014/0147794 A1 | 5/2014 | Sugie et al. | |
| 2014/0148012 A1 | 5/2014 | Guillorn et al. | |

FOREIGN PATENT DOCUMENTS

| | | |
|---|---|---|
| JP | 6-337524 A1 | 12/1994 |
| WO | 2014/069245 A1 | 5/2014 |

OTHER PUBLICATIONS

Liu, C. et al., "Toward electrical testable SOI devices using DSA for fin formation", Proc. of SPIE, vol. 9049, 2014, pp. 1-12.

Tsai, H. et al., "Two-Dimensional Pattern Formation Using Graphoepitaxy of PS-b-PMMA Block Copolymers for Advanced FinFET Device and Circuit Fabrication", ACS Nano, vol. 8, No. 5, 2014, pp. 5227-5232.

Liu, C. et al., "Directed Self-Assembly Process Implementation in a 300mm Pilot Line Environment", Proc. of SPIE, vol. 8680, 2013, pp. 1-8.

Cheng, J. et al., "Simple and Versatile Methods to Integrate Directed Self-Assembly with Optical Lithography Using a Polarity-Switched Photoresist", ACSNANO, vol. 4, No. 8, 2010, pp. 4815-4823.

List of IBM Patents or Patent Applications Treated as Related, dated Apr. 28, 2015, 2 pages.

* cited by examiner

METHOD TO HARDEN PHOTORESIST FOR DIRECTED SELF-ASSEMBLY PROCESSES

BACKGROUND

The present application relates to semiconductor processing, and more particularly to a method of forming a patterned photoresist that has been chemically altered such that it is no longer soluble in its original casting solution.

Directed self-assembly (DSA) refers to the integration of block copolymer (BCP) materials that undergo phase separation with traditional semiconductor manufacturing processes. With DSA, nanoscale dimensions are achieved at a drastically reduced cost by novel material designs without additional equipment upgrades.

Photoresist hardening is commonly used and, in some cases, is a crucial step in DSA processes. Ultra-violet (UV) and thermal frozen approaches can be used to achieve hardening of the photoresist material. These prior art resist hardening processes have some drawbacks associated therewith. For example, in some DSA processes there is a need for the resist to be soluble to the developer after hardening. However, thermally frozen resists are normally not solution soluble after hardening. UV irradiation requires expensive hardware, e.g., the scanner, or additional specifically designed modules or stand-alone tools.

In view of the above, there is a need for providing an alternative method for hardening a photoresist material that can render the harden resist material soluble to the developers after hardening and which does not require expensive hardware, additional specifically designed modules or stand-alone tools.

SUMMARY

A patterned photoresist is provided atop a substrate. A hardening agent is applied to the patterned photoresist to provide a polymeric coated patterned photoresist. The polymeric coated patterned photoresist is baked to provide a hardened photoresist, and thereafter the polymeric coating is removed from the hardened photoresist by rinsing. The hardened photoresist can be removed anytime during the patterning of the substrate by an aqueous resist developer.

In one aspect of the present application, a method of hardening a patterned photoresist is provided. The method includes forming a patterned photoresist atop a substrate. Next, the patterned photoresist is coated with a hardening agent to provide a polymeric coating surrounding the patterned photoresist. The polymeric coating and the patterned photoresist is then baked to provide a hardened photoresist. After baking, a rinse is employed to remove the polymeric coating from the hardened photoresist.

DETAILED DESCRIPTION

Figure 1:
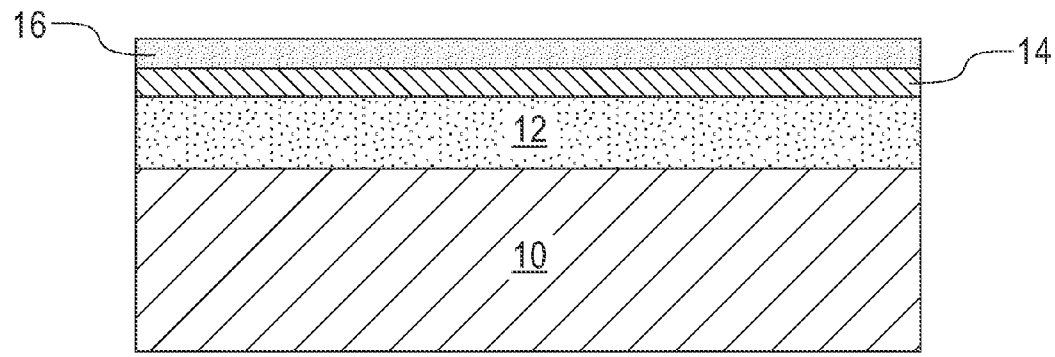
FIG. 1 is a cross sectional view on an exemplary structure including a lithographic material stack located on a surface of a substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary structure including a lithographic material stack (12, 14 and 16) located on a surface of a substrate 10 that can be employed in accordance with an embodiment of the present application. The lithographic material stack may include, from bottom to top, an optical planarization layer 12, an antireflective coating 14 and orientation control layer 16. In some embodiments, orientation control layer 16 can be omitted. In another embodiment, one or more hard masks (not shown) can be included within the lithographic material stack, typically between the optical planarization layer 12 and the substrate 10, for etching purposes.

Substrate 10 that can be used in the present application includes any material or material stack that can subsequently patterned by utilizing at least one (typically, more than one) patterned photoresist portion as an etch mask. Substrate 10 can be, for example, a semiconductor material, an insulator material, a conductive material or any combination or multilayered stack thereof.

In one embodiment of the present application, substrate 10 can be composed totally of, or partially of, a semiconductor material. In some embodiments, the semiconductor material that provides at least a part of substrate 10 is itself a substrate or a component of a substrate. In yet other embodiments, the semiconductor material that can provide at least part of substrate 10 may be a component of a semiconductor device.

In some embodiments, the substrate material that provides at least a portion of substrate 10 can be a bulk semiconductor material. The term "bulk semiconductor material" denotes a substrate that is entirely composed of at least one semiconductor material. When a bulk semiconductor material is employed as at least a portion of substrate 10, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide at least a portion of substrate 10 can be comprised of a single crystalline semiconductor material, such as, for example, single crystalline silicon. In other embodiments, the bulk semiconductor substrate that can provide at least a portion of substrate 10 may comprise a polycrystalline or amorphous semiconductor material.

In some embodiments, substrate 10 may be composed entirely of, or at least partially of, a semiconductor-on-insulator (SOI) substrate (not specifically shown). As is known to one skilled in the art, an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (Separation by IMplantation of OXygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one example, the thickness of the topmost semiconductor layer of the SOI substrate can be from 10 nm to 100 nm. In some embodiments, and when an ETSOI (extremely thin semiconductor-on-insulator) substrate is employed, the topmost semiconductor layer of the SOI has a thickness of less than 10 nm. If the thickness of the topmost semiconductor layer is not within one of the above mentioned ranges, a thinning step such as, for example, planarization or etching can be used to reduce the thickness of the topmost semiconductor layer to a value within one of the ranges mentioned above. The insulator layer of the SOI substrate typically has a thickness from 1 nm to 200 nm, with a thickness from 100 nm to 150 nm being more typical. The thickness of the handle substrate of the SOI substrate is inconsequential to the present application.

In some embodiments, substrate 10 can be composed entirely of, or at least in part of an insulator material. The insulator material that forms at least a portion of substrate 10 can be an organic insulator, an inorganic insulator or any combination including multilayers thereof. In some embodiments, the insulator material that forms at least a portion of substrate 10 can be a component of a semiconductor device such as, for example, a transistor, or capacitor. In other embodiments, the insulator material that forms at least a portion of substrate 10 can be a passivation layer, a hard mask material, or a spacer material. In yet another embodiment, the insulator material that provides at least a portion of the substrate 10 can be one interconnect level of an interconnect structure. The insulator material that can be used as at least a portion of substrate 10 is not limited to the examples mentioned above.

The insulator material that provides at least a portion of substrate 10 may have a dielectric constant, k, of less than silicon dioxide, or a dielectric constant, k, that is equal to or greater than silicon dioxide. In some embodiments, the insulator material that provides at least a portion of substrate 10 can be a semiconductor oxide, semiconductor nitride, semiconductor oxynitride, and/or dielectric metal oxide. Examples of insulator materials that can be used include, but are not limited to, silicon dioxide, silicon nitride, silicon oxynitride, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof, wherein each value of x is independently from 0.5 to 3 and each value of y is independently from 0 to 2, silsequioxanes, C doped oxides (i.e., organosilicates) that comprise, consist essentially of, or consists of, atoms of Si, C, O and H, thermosetting polyarylene ethers, and/or doped or undoped silicate glasses.

In some embodiments, substrate 10 can be composes entirely of, or at least in part of a conductive material. The conductive material that provides at least a portion of substrate 10 may be a doped semiconductor material, an elemental metal, an alloy consisting of at least two elemental metals, a metal semiconductor alloy (i.e., a metal silicide or germanide), a metal nitride, or any combination thereof including multilayers. In some embodiments, the conductive material that forms at least a portion of substrate 10 may be located atop a semiconductor material and/or an insulator material. In yet other embodiments, the conductive material that forms at least a portion of substrate 10 can be embedded within a semiconductor material and/or insulator material.

The optical planarization layer 12 of the lithographic material stack that can be employed in the present application comprises a self-planarizing material. As used herein, a self-planarizing material is a material that flows at a standard ambient temperature and pressure (SATP), i.e., 20° C. (293.15 K, 68° F.) and an absolute pressure of 101.325 kPa (14.696 psi, 1 atm), to provide a planar top surface. In one example, the optical planarization layer 12 can be an organic material including C, O, and H, and optionally including Si and/or F. In another example, the optical planarization layer 12 can be amorphous carbon. In a further example, the optical planarization layer 12 can be a spin-on carbon material. In an even further example, diamond-like carbon can be used as the material of the optical planarization layer 12. The optical planarization layer 12 can be formed by spin-on coating, chemical vapor deposition, plasma enhanced chemical vapor deposition, evaporation or chemical solution deposition. The thickness of the optical planarization layer 12 can be from 10 nm to 300 nm, although lesser and greater thicknesses can also be employed.

The antireflective coating 14 of the lithographic material stack comprises any material that can reduce image distortions associated with reflections off the surface of substrate 10. In one example, the antireflective coating 14 of the lithographic material stack comprises a silicon (Si)-containing antireflective coating material. The antireflective coating 14 can be formed by spin-on coating, chemical vapor deposition, plasma enhanced chemical vapor deposition, atomic layer deposition (ALD), plasma-enhanced ALD, evaporation or chemical solution deposition. The thickness of the antireflective coating 14 can be from 10 nm to 150 nm, although lesser and greater thicknesses can also be employed.

The orientation control layer 16 of the lithographic material stack is a polymer layer that can adhere to an underlying surface and achieve a certain desired surface energy. The orientation control layer 16 is typically a random copolymer that contains a polar polymeric component and a non-polar polymeric component; the random copolymer that can be used in providing the orientation control layer 16 may have the same or different polymeric components as defined below for the copolymer layer that provides the self-assembled block copolymer structure. By "random" it is meant a polymeric material that lacks any defined repeating blocks. In one example, the orientation control layer 16 may comprise a random copolymer of poly (methyl methacrylate) (i.e., PMMA) as the polar polymeric component, and polystyrene (PS) as the non-polar polymeric component. By controlling the ratio of non-polar polymeric component (i.e., PS) to polar polymeric component (i.e., PMMA) in the synthesis stage, one can achieve a desired surface property. In some embodiments, and to anchor the random copolymer to the underlying surface of the antireflective coating 14, one or several functional groups can be added to the end of the polymer chain or in a random position of the polymer chain to react with the antireflective coating and create covalent bonding. Cross linkers such as, for example, azide ($N_3$), benzocyclobutane (BCB), and glycidyl methacrylate (GMA) can also be used to improve adhesion to the antireflective coating 14 because of the polymer network after cross linking. The orientation control layer 16 can be formed by spin-on coating, evaporation or chemical solution deposition. The thickness of the orientation control layer 16 can be from 2 nm to 20 nm, although lesser and greater thicknesses can also be employed.

Figure 2:
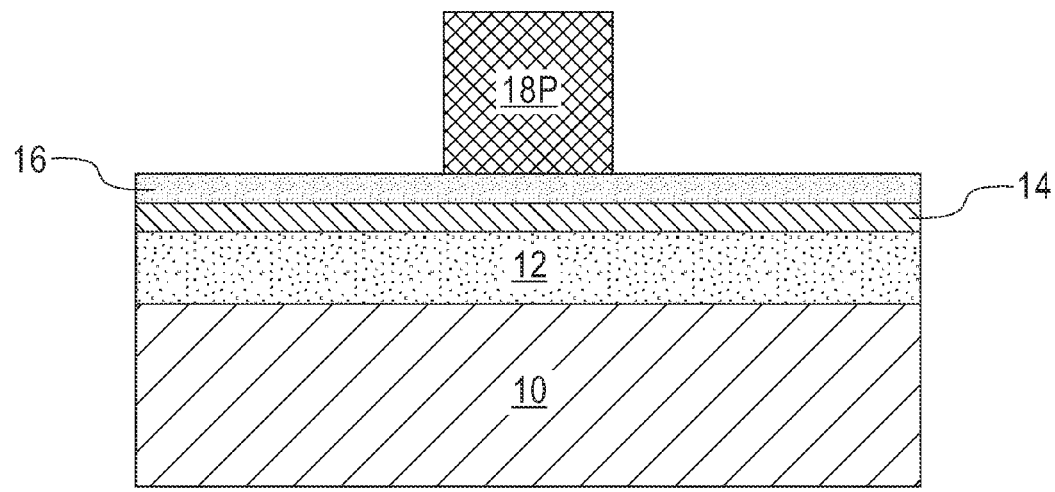
FIG. 2 is a cross sectional view of the exemplary structure of FIG. 1 after forming a patterned photoresist located on a surface of the lithographic material stack.

Referring now to FIG. 2, there is illustrated the exemplary structure of FIG. 1 after forming a patterned photoresist 18P located on a surface of the lithographic material stack (12, 14, 16). Although a single patterned photoresist 18P is described and illustrated, a plurality of patterned and spaced apart photoresists 18P can be formed on the lithographic material stack (12, 14, 16) and atop substrate 10.

The patterned photoresist 18P can be provided by first forming a blanket layer of photoresist material (not shown) on the topmost surface of the lithographic material stack (12, 14 and 16). The photoresist material that may be employed in the present application includes a positive-tone photoresist material. The photoresist material can be formed utilizing a deposition process such as, for example, spin-on coating or chemical solution deposition. The thickness of the blanket layer of photoresist material can be from 50 nm to 250 nm, although lesser and greater thicknesses can also be employed. The blanket layer of photoresist material is then patterned by lithography. Lithography includes exposing the blanket layer of photoresist material to a desired pattern of irradiation and then developing the photoresist material utilizing a conventional resist developer. The shape and size of the patterned photoresist 18P can vary and is not limited to a rectangular structure as shown in FIG. 2 of the present application.

Figure 3:
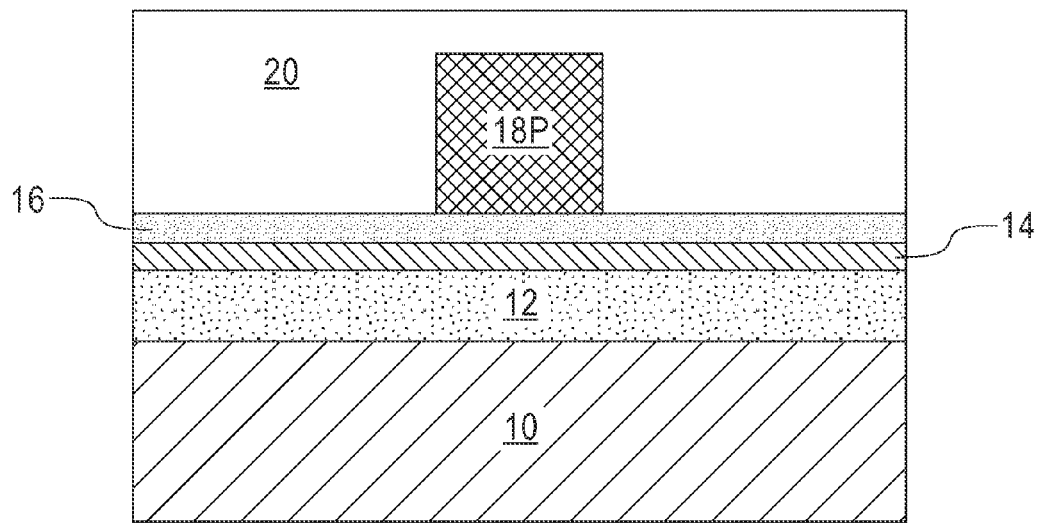
FIG. 3 is a cross sectional view of the exemplary structure of FIG. 2 after coating the patterned photoresist with a hardening agent.

Referring now to FIG. 3, there is illustrated the exemplary structure of FIG. 2 after coating the patterned photoresist 18P with a hardening agent. This step of the present application forms a polymeric coating 20 composed of the hardening agent surrounding the sidewalls and topmost surface of the patterned photoresist 18P. The hardening agent that is employed in the present application includes a material (typically polymeric) that can provide a hardened photoresist. The term "hardened photoresist" is used throughout the present application to denote a photoresist material that has been chemically altered or "de-protected" or "polarity switched" such that it is no longer soluble in its original casting solvent.

The hardening agent can be applied to the patterned photoresist 18P utilizing various coating methods including, for example, spin-coating, spray coating, dip coating, brush coating or other like coating methods. Examples of hardening agents that can be used in the present application include conventional thermal acid generators such as, for example, polymer structures containing sulfur-containing acid moieties. Such polymers may have an ethylenic backbone including those comprised of monomer units selected from vinyl, acrylates, methacrylates or combinations thereof.

In one embodiment of the present application, the hardening agent that can be used in the present application is a polymer such as, described at col. 6, lines 38-64 of U.S. Pat. No. 8,137,893 B2 to Burns et al., the entire content of which is incorporated herein by reference. Notably, the hardening agent that can be used in the present application includes at least one monomeric unit having a structure selected from:

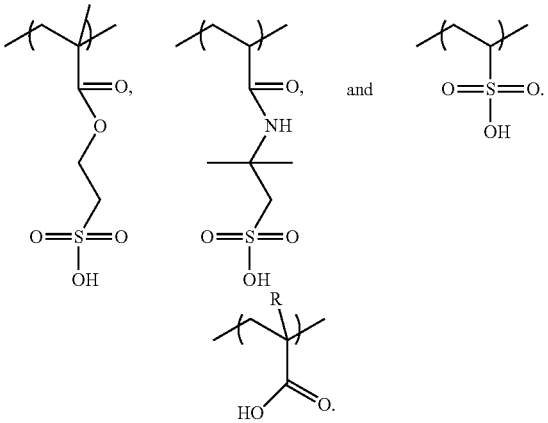

wherein R is Cl, F, Br, I, $CCl_2$, $CF_3$, $CBr_3$, CN, NO or $NO_2$. In some embodiments, the acidic polymer that can be used as the hardening agent can further include a halogen, a cyano, or a nitro-containing carboxylic acid moiety.

Figure 4:
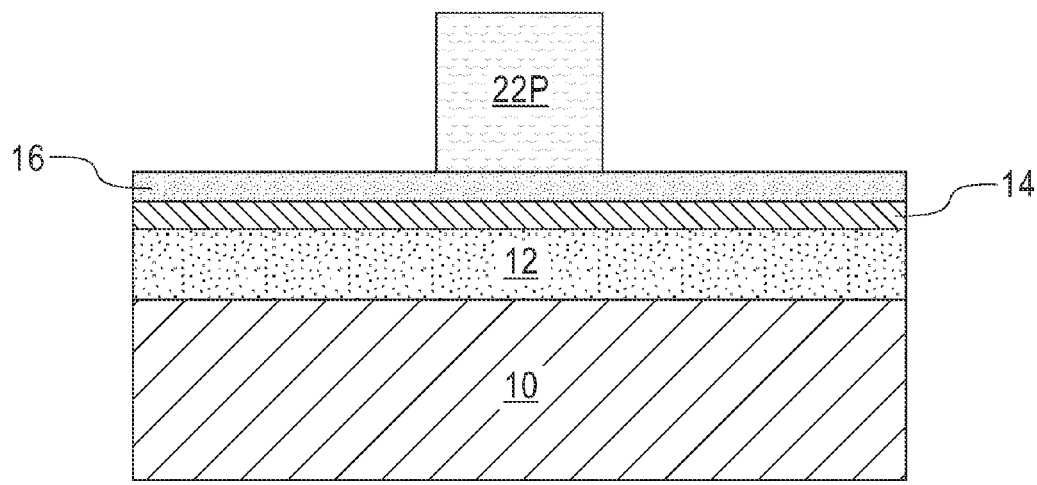
FIG. 4 is a cross sectional view of the exemplary structure of FIG. 3 after performing a baking step and a rinsing step to provide a hardened photoresist.

Referring now to FIG. 4, there is illustrated the exemplary structure of FIG. 3 after performing a baking step and a rinsing step to provide a hardened photoresist 22P. The baking step modifies the polymeric coated patterned photoresist shown in FIG. 3 to be insoluble in the casting solvent of the photoresist. During the baking process, acid is released from the polymeric coating 20 and a deprotection reaction occurs within the original patterned photoresist 18P. In one embodiment of the present application, the baking process can be performed at a temperature from 100° C. to 160° C. Other temperatures that are lesser than, or greater than, the aforementioned temperature range can be used as long as the temperature of the baking process provides the acid releasing from the acidic polymer coating to each of the patterned photoresists. The degree of hardening of the patterned photoresist is greatest in portions of the patterned photoresist 18P that is nearest to the external sidewall surfaces and topmost surface of the patterned photoresist 18P. The degree of hardening decreases inward from the external sidewall surfaces and topmost surface of the patterned photoresist 18P. A second baking step, as mentioned below, may be performed which enhances the degree of hardening.

The baking process can be performed in air or in an inert ambient including, for example, nitrogen, helium, argon, neon, or mixtures thereof. The baking process can be performed for a time period from 30 seconds to 5 minutes. Other times can also be used for the baking process.

A rinse step in a solvent follows the baking step in order to remove the polymeric coating 30, while retaining the hardened photoresist 22P on the surface of substrate 10. The solvent that is used for the rinse step may include, for example, the casting solvent of the hardening agent, 4-methyl-2-pentanol (4M2P or MIBC). The rinse step may involve a single solvent rinse or multiple solvent rinsing steps can be used to remove polymeric coating 30 from the hardened photoresist 22P.

In some embodiments of the present application, an optional second baking process may be performed after the rinsing step. The conditions (temperature, time and ambient) mentioned for the first baking process can also be used for the second baking process.

In some embodiments of the present application, and when multiple patterned photoresists are formed, each of the patterned photoresists can be subjected to the above process to provide a plurality of spaced apart hardened photoresists which can be used as guiding pattern masks which are soluble in an aqueous developer.

In one application, a copolymer layer (not shown) can be formed between each neighboring pair of guiding pattern masks and thereafter a directed self-assembly (DSA) process may be performed to provide a self-assembled block copolymer structure (not shown). These steps convert the copolymer layer into a self-assembled block copolymer structure located between each neighboring pair of guiding pattern masks. In such an embodiment, the self-assembled block copolymer structure is located on a topmost surface of the lithographic material stack (12, 14 and 16) and comprises an array of first phase separated polymeric domains (not shown) and an array of second phase separated polymeric domains (not shown). The copolymer layer can be applied between each guiding pattern mask, for example, by spin coating or chemical solution deposition. The copolymer material that provides the copolymer layer comprises a first polymeric block component and a second polymeric block component that are immiscible with each other. In some embodiments of the present application, the material that provides the copolymer layer may be self-planarizing. The copolymer material includes self-assembling block copolymers that are capable of self-organizing into nanometer-scale patterns. By "nanoscale patterns" it is meant features that have a size of less than 40 nm.

The copolymer layer can include a first polymer material, i.e., a first polymeric block component, and a second polymer material, i.e., a second polymeric block component. The first polymeric block component and the second polymeric block component are selected such that a self-assembly of first polymer blocks including the first polymeric block component and second polymer blocks including the second polymeric block component can be subsequently formed upon phase separation of the first and second polymeric block components. The phase separated first polymeric copolymer component is referred to as the "first phase separated polymeric domain", while the phase separated second polymeric copolymer component is referred to herein as the "second phase separated polymeric domain". Exemplary materials for the first polymeric block component and the second polymeric block component are described in U.S. Pat. No. 7,605,081 to Yang et al., the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In one embodiment, polystyrene-block-polymethylmethacrylate (PS-b-PMMA) is used.

The self-assembling block copolymers are first dissolved in a suitable solvent system to form a block copolymer solution, which is then applied into each of opening provided by the guiding pattern masks. The solvent system used for dissolving the block copolymer and forming the block copolymer solution may include any suitable solvent, which can include, but is not limited to: toluene, propylene glycol monomethyl ether acetate (PGMEA), propylene glycol monomethyl ether (PGME), and acetone. The copolymer material is not a conventional photoresist that may be developed upon exposure to ultraviolet light or optical light. Also, the copolymer layer is not a conventional low-k dielectric material.

After forming the copolymer layer within each opening and on the exposed topmost surface of the lithographic material stack (12, 14 and 16), a self-assembled block copolymer structure (i.e., nanoscale self-assembled self-aligned structure) can be formed within each of the openings by causing phase separation of the self-assembling block copolymers through annealing. Each self-assembled block copolymer structure is self-aligned to the vertical sidewalls of each guiding pattern mask and thus may be herein referred to as a "self-aligned assembly." In one embodiment, the copolymer layer can be annealed by solvent vapor annealing or by thermal annealing at an elevated temperature to form the first phase separate polymeric domains including the first polymeric block component, and the second phase separate polymeric domains including the second polymeric block component. The anneal may be performed, for example, at a temperature from about 200° C.

to about 300° C. for a duration from 30 seconds to about 10 hours. Other anneal conditions (i.e., temperatures and times) may also be used in the present application to convert the copolymer layer into the self-assembled block copolymer structure.

Each of the first phase separated polymeric domains has a first width. Each of the second phase separated polymeric domains has a second width. In some embodiments, the second width is the same as the first width. In other embodiments, the second width is different from the first width. Each of the first width and second widths are sub-lithographic, i.e., less than 40 nm.

As is known to those skilled in the art, each first phase separated polymeric domain and each second phase separated polymeric domain of each self-assembled block copolymer structure repeat in a regular pattern. One of the phase separated polymeric domains can be used as a patterned mask.

In the DSA embodiment, each guiding pattern mask (i.e., hardened photoresist 22P) can be removed from the structure. Each guiding pattern mask can be removed utilizing an etching process that is selective in removing the material that provides each guiding pattern mask and without damaging the self-assembled copolymer structure. In one embodiment of the present application and when a hardened photoresist 22P is employed as each guiding pattern mask, each guiding pattern mask can be removed utilizing an aqueous resist developer such as, for example, aqueous tetramethylammonium hydroxide (TMAH). Each self-assembled block copolymer structure remains after removing each guiding pattern mask.

Next, one of the phase separated domains is removed, while retaining the other phase separated domain of each self-assembled block copolymer. For example, and in one embodiment, each first phase separated polymeric domain of the self-assembled block copolymer structure can be selectively removed relative to each second phase separated polymeric domain of the self-assembled block copolymer structure. In some embodiments, this step may also remove portions of the underlying orientation control layer 16 not located directly underneath each remaining second phase separated polymeric domain; each second phase separated polymeric domain acts as a mask during this step of the present application. The selected phase separated polymeric domain can be removed utilizing an etching process that selectively removes the materials of one of the phase separated polymeric domains and the underlying orientation control layer 16. In one embodiment, an oxygen-based etching process can be used. Patterning of the substrate 10 can continue utilizing the remaining phase separated domains as etch masks. The patterning of substrate 10 may include one or more etching (anisotropic or isotropic) processes as known in the art.

Figure 5:
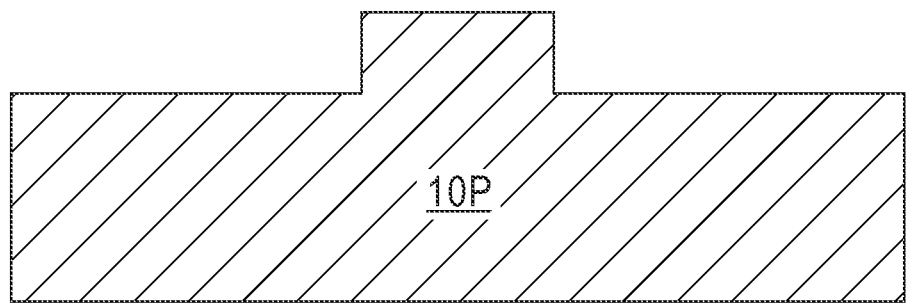
FIG. 5 is a cross sectional view of the exemplary structure of FIG. 4 after patterning the substrate.

Referring now to FIG. 5, there is illustrated the exemplary structure of FIG. 4 after patterning the substrate 10. The portion of the substrate 10 that remains may be referred to here as patterned substrate 10P. In the illustrated embodiment, the patterning of substrate 10 utilizes the hardened resist 22P as an etch mask during at least one of the pattern transfer etching steps. Any conventional etching process or combination of etching processes (anisotropic and/or isotropic) can be used in the present application to complete the pattern transfer. The hardened photoresist 22P can be removed anytime during the pattern transfer process. In one embodiment, the hardened resist 22P can be removed utilizing an aqueous resist developer such as, for example, aqueous tetramethylammonium hydroxide (TMAH). Remaining portions of the lithographic mask (12, 14 and 16) can be removed anytime during the pattern transfer and after the pattern has been transferred into at least the topmost material of the lithographic mask. The remaining portions of the lithographic material may be removed utilizing chemical mechanical planarization and/or etching. In some embodiments, and as mentioned above, the hardened mask 22P can be used as a guiding pattern mask during a DSA process (as also explained above) to provide a patterned substrate 10P having sub-lithographic dimensions.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a hardened photoresist, said method comprises:
   forming a patterned photoresist atop a substrate;
   coating said patterned photoresist with a hardening agent to provide a polymeric coating surrounding said patterned photoresist, said hardening agent consisting of a thermal acid generator;
   baking said polymeric coating and said patterned photoresist to provide a hardened photoresist, said hardened photoresist having a different polarity than said patterned photoresist; and
   rinsing said hardened photoresist to remove said polymeric coating from said hardened photoresist.

2. The method of claim 1, wherein prior to said forming said patterned photoresist, a lithographic material stack is formed between said substrate and said patterned photoresist.

3. The method of claim 2, wherein said lithographic material stack comprises, from bottom to top, an optical planarization layer, an antireflective coating, and an orientation control layer.

4. The method of claim 3, wherein said antireflective coating comprises a silicon containing antireflective coating material.

5. The method of claim 3, wherein said optical planarization layer comprises amorphous carbon, spin-on carbon, an organic material including at least C, O, and H, or diamond-like carbon.

6. The method of claim 3, wherein said orientation control layer comprises a random copolymer containing a polar polymeric component and a non-polar polymeric component.

7. The method of claim 1, wherein said forming said patterned photoresist comprises:
   forming a blanket layer of photoresist material atop said substrate; and
   patterning said blanket layer of photoresist material by lithography to provide said patterned photoresist portion.

8. The method of claim 1, wherein said thermal acid generator comprises a polymer structure containing sulfur-containing acid moieties and having an ethylenic backbone.

9. The method of claim 8, wherein said ethylenic backbone comprises a monomer unit selected from vinyl, acrylates, methacrylates and combinations thereof.

10. The method of claim 9, wherein said hardening agent comprises at least one monomeric unit having a structure selected from:

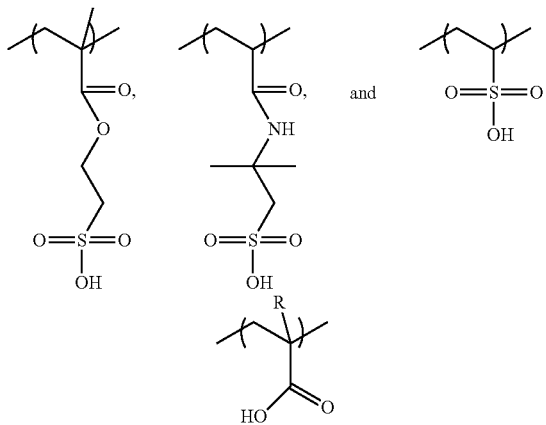

wherein R is Cl, F, Br, I, CCl$_2$, CF$_3$, CBr$_3$, CN, NO or NO$_2$.

11. The method of claim 1, wherein said coating said patterned photoresist with said hardening agent comprises spin-coating, spray coating, dip coating or brush coating.

12. The method of claim 1, wherein said baking is performed at a temperature from 100° C. to 160° C.

13. The method of claim 1, wherein said baking releases acid from said polymeric coating into the patterned photoresist.

14. The method of claim 1, wherein said rinsing includes contacting with a solvent.

15. The method of claim 1, further comprising another baking process after said rinsing.

16. The method of claim 1, wherein said forming said patterned photoresist comprises forming a plurality of spaced apart photoresists.

17. The method of claim 1, further comprising patterning said substrate utilizing said hardened photoresist as an etch mask or as a guiding pattern mask in a directed self-assembly process.

18. The method of claim 17, further comprising removing said hardened photoresist anytime during said patterning.

19. The method of claim 18, wherein said hardened photoresist is removed by an aqueous resist developer.

* * * * *